US008053376B2

(12) United States Patent
Wang et al.

(10) Patent No.: US 8,053,376 B2

(45) Date of Patent: Nov. 8, 2011

(54) ONE-STEP SYNTHESIS AND PATTERNING OF ALIGNED POLYMER NANOWIRES ON A SUBSTRATE

(75) Inventors: Zhong L. Wang, Marietta, GA (US); Xudong Wang, Atlanta, GA (US); Jenny R. Morber, Atlanta, GA (US); Jin Liu, Danbury, CT (US)

(73) Assignee: Georgia Tech Research Corporation, Atlanta, GA (US)

(*) Notice: Subject to any disclaimer, the term of this patent is extended or adjusted under 35 U.S.C. 154(b) by 236 days.

(21) Appl. No.: 12/492,333

(22) Filed: Jun. 26, 2009

(65) Prior Publication Data

US 2009/0322218 A1 Dec. 31, 2009

Related U.S. Application Data

(60) Provisional application No. 61/076,308, filed on Jun. 27, 2008.

(51) Int. Cl.
*H01L 21/31* (2006.01)
*H01L 21/469* (2006.01)

(52) U.S. Cl. ............ 438/780; 438/9; 438/781; 438/782; 257/E21.007; 257/E21.053; 257/E21.077; 257/E21.134; 257/E21.218; 257/E21.264

(58) Field of Classification Search ................ 438/9, 99, 438/608, 602, 780, 781, 782, 792, 795, 798; 257/E21.007, 53, 77, 134, 218, 264
See application file for complete search history.

(56) References Cited

U.S. PATENT DOCUMENTS 5,876,487 A * 3/1999 Dahlgren et al. ................ 96/13
6,214,095 B1 * 4/2001 Logan et al. .................. 96/147

* cited by examiner

*Primary Examiner* — David Nhu
(74) *Attorney, Agent, or Firm* — Bryan W. Bockhop; Bockhop & Associates, LLC

(57) ABSTRACT

In a method of making a polymer structure on a substrate a layer of a first polymer, having a horizontal top surface, is applied to a surface of the substrate. An area of the top surface of the polymer is manipulated to create an uneven feature that is plasma etched to remove a first portion from the layer of the first polymer thereby leaving the polymer structure extending therefrom. A light emitting structure includes a conductive substrate from which an elongated nanostructure of a first polymer extends. A second polymer coating is disposed about the nanostructure and includes a second polymer, which includes a material such that a band gap exists between the second polymer coating and the elongated nanostructure. A conductive material coats the second polymer coating. The light emitting structure emits light when a voltage is applied between the conductive substrate and the conductive coating.

14 Claims, 3 Drawing Sheets

ONE-STEP SYNTHESIS AND PATTERNING OF ALIGNED POLYMER NANOWIRES ON A SUBSTRATE

CROSS-REFERENCE TO RELATED APPLICATION(S)

This application claims the benefit of US Provisional Patent Application Ser. No. 61/076,308, filed Jun. 27, 2008, the entirety of which is hereby incorporated herein by reference.

STATEMENT OF GOVERNMENT INTEREST

This invention was made with support from the U.S. government under grant number DE-FG02-07ER46394, awarded by the Department of Energy. The government may have certain rights in the invention.

BACKGROUND OF THE INVENTION

1. Field of the Invention

The present invention relates to polymer nanostructures and, more specifically, to a method of synthesizing aligned polymer nanostructures.

2. Description of the Prior Art

Aligned nanowires of inorganic semiconductor materials have important applications in photonics, electronics, sensing, bioscience and energy science. Highly desirable in such applications is cost-effective growth of high quality, patterned and uniformly aligned nanowires on a large scale. Aligned inorganic nanowire arrays can be grown using either the vapor-liquid-solid and vapor-solid-solid process at high temperature (>~500° C.) with the assistance of catalyst particles, or the seed assisted chemical growth at low temperature.

There is an emerging need to fabricate high-performance polymer nanowire (PNW) based nanodevices for flexible electronics and photonics, but the above approaches are likely inapplicable for such purpose. Although templating, chemical synthesis, and even a few ion generating techniques have yielded some such devices, they do not lend themselves to simple and scalable techniques for producing high quality and controllable polymer nanowire arrays with the ability to pattern these polymer nanowires over a large scale.

Fabrication of polymer nanowire arrays of functional polymers has important applications ranging from printable electronics, to implantable synthetic human muscles to sensors and wires in smart clothing. Thin films of conductive polymers such as PEDOT:PSS (poly(3,4-ethylenedioxythiophene) poly(styrenesulfonate)) have been used to develop organic light emitting diodes (OLEDs), flexible displays and organic solar cells. Semi-crystalline PVDF (polyvinylidene difluoride) is widely exploited for its high Young's modulus and unique piezoelectric properties. While most organic devices are based on thin film configurations, patterned and aligned polymer nanowires could be used in improving integrated miniaturization of flexible electronics, including sensing textiles, bio-feedback devices, and flexible displays.

Therefore, there is a need for cost effective, scalable system for synthesizing aligned polymer nanowires.

SUMMARY OF THE INVENTION

The disadvantages of the prior art are overcome by the present invention which, in one aspect, is a method of making a polymer structure on a substrate in which a layer of a first polymer, having a horizontal top surface, is applied to a surface of the substrate. An area of the top surface of the polymer is manipulated so at to create a surface portion that is non-parallel to the horizontal top surface. The uneven feature is plasma etched so as to remove a first portion from the layer of the first polymer thereby leaving the polymer structure extending from the layer of the first polymer.

In another aspect, the invention is a light emitting structure that includes a conductive substrate, an elongated nanostructure, a second polymer coating and a conductive coating. The conductive substrate has a top surface. The elongated nanostructure includes a conductive first polymer and extends upwardly from the top surface of the substrate. The second polymer coating is disposed about at least a portion of the elongated nanostructure and includes a second polymer that is different from the first polymer. The second polymer includes a material such that a band gap exists between the second polymer coating and the elongated nanostructure. The conductive coating is disposed about at least a portion of the second polymer coating. The light emitting structure emits light when a voltage is applied between the conductive substrate and the conductive coating.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
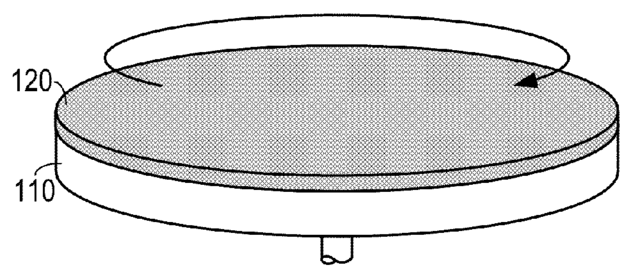
FIG. 1 is a schematic diagram showing spin coating of a substrate with a polymer.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." "Nanostructure" means a structure having at least one dimension that is less than 1 micrometer.

Also, as used herein "ITO" means indium tin oxide; "MEH-PPV" means poly[2-methoxy-5-(2'-ethyl-hexyloxy)-1,4-phenylene vinylene; "PEDOT:PSS" means (poly(3,4-ethylenedioxythiophene)poly(styrenesulfonate); means "PVDF" (polyvinylidene difluoride); "PPY" means polymer polypyrrole; "SU8" means an epoxy-based photoresist; and "PMMA" means poly(methyl methacrylate).

One embodiment is a one-step, clean method of fabrication of wafer-level patterned and aligned polymer nanowires or polymer micro- and nano-tube arrays, which are made by exposing a polymer material to plasma etching. The formation mechanism of the polymer nanowires (and polymer nanotubes and microtubes) is suggested due to a dependence of the cone-shape interaction volume between the ion and the polymer on its local incident-angle at the modulated surface. The present technique is capable of fabricating polymer nanowire arrays of many different polymers on substrates of many different types of materials (including crystalline materials, amorphous materials, flexible materials and fibrous materials). The aligning and patterning procedure provides a powerful nanofabrication technique that could lead to high-performance polymer-based flexible electronics, optoelectronics, sensors and photonics that can be fully integrated with silicon technology.

As shown in FIG. 1, in one embodiment, a polymer is applied to a substrate 110 (which could be, for example, a silicon wafer) employing spin coating so as to form a polymer layer 120. This method can employ almost any polymer. Several examples of suitable polymers include: ITO, MEH-PPV, PEDOT:PSS, PVDF, PPY, SU8, PMMA and PS. While some might not consider liquid crystals and other organic materials to be a polymers, it is intended that liquid crystal materials and other such organic materials be included in the list of suitable examples of polymers and that the scope of claims below include such materials being used as the polymer.

At least a portion of the surface of the polymer layer 120 is manipulated to form an uneven feature, which could take the form of a protrusion from the surface of the polymer layer 120 or an indentation into the surface of the polymer layer 120. The surface of the polymer layer 120 is then plasma etched in an inductively coupled plasma (ICP) reactive ion etching chamber. The plasma etching process ablates the polymer molecules from the surface of the polymer layer 120 at different rates depending on the angle of the part of the uneven feature relative to the surface of the polymer layer 120: horizontal surfaces normal to the direction of plasma movement in the ICP etching chamber tend to ablate faster than angled surfaces having a vertical component. It is believed that angled surfaces tend to deflect the plasma whereas horizontal surfaces tend to react with the plasma at a faster rate.

Figure 2A:
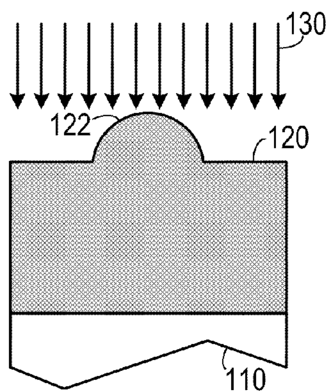
FIG. 2A-2C are a series of schematic diagrams showing plasma etching of a polymer layer with a protrusion extending therefrom.
Figure 2B:
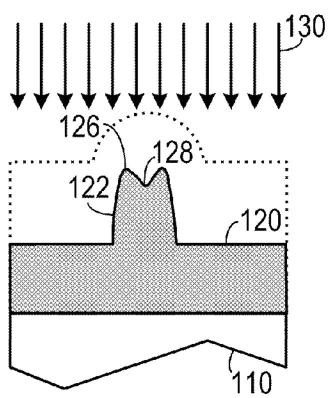
Figure 2C:
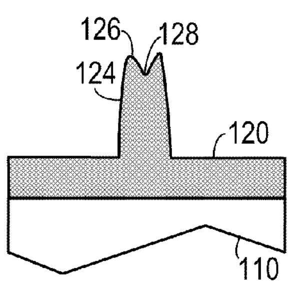

As shown in FIGS. 2A-2C, when a protrusion 122 extends from the plasma layer 120, the plasma 130 ablates the horizontal portions of the plasma layer 120 and the protrusion 122 at a faster rate than the angled portions of the protrusion 122. Eventually, a rod-like structure 124, having a peripheral protrusion 126 and a central indentation 128 is left. If an array of protrusions 122 are formed on the plasma layer 120 then the result would be a corresponding array of rod-like structures 124.

Figure 3A:
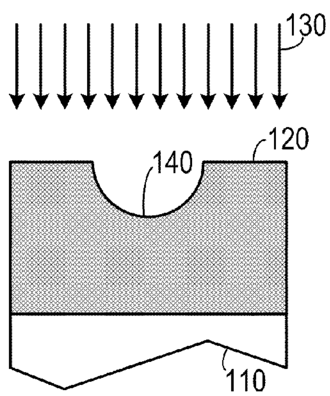
FIG. 3A-3C are a series of schematic diagrams showing plasma etching of a polymer layer with an indentation therein.
Figure 3B:
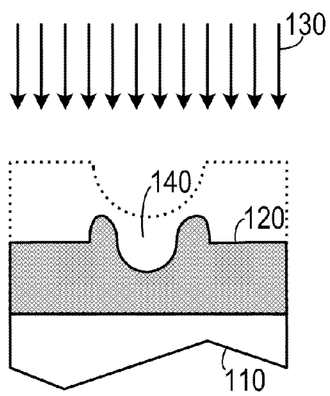
Figure 3C:
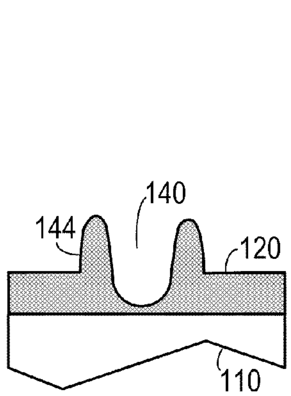

As shown in FIGS. 3A-3C, if an indentation 140 is imparted into the surface of the polymer layer 120, then the plasma 130 will ablate the horizontal surfaces faster than the angled surfaces, resulting in a tube-like structure 144.

Protrusions and indentations may be imparted on the surface of the polymer layer 120 in a variety of ways, including impressing a textured surface (such as a mold) onto the polymer layer 120, scratching the polymer layer 120 (such as with a probe tip of an atomic force microscope or with a micro-scale needle), quickly exposing the surface of the polymer layer 120 to a reactant (such as an acid), exposing the surface of the polymer layer 120 to a focused energy source (such as a laser), etc. Known photolithography techniques may be used to create specific patterns of nanotubes.

Figure 4A:
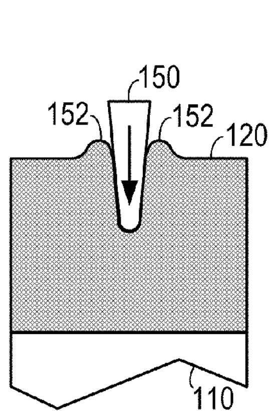
FIG. 4A-4C are a series of schematic diagrams showing the creation of an indentation with a probe tip and the plasma etching of the indentation.
Figure 4B:
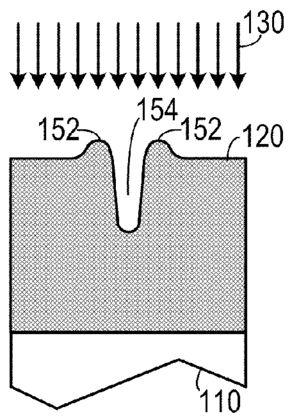
Figure 4C:
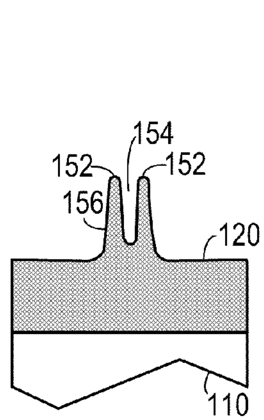

As shown in FIGS. 4A-4C, a probe tip 150 (such as one used in atomic force microscopy) can be impressed into the surface of the polymer layer 120 to form an indentation 154 and a peripheral ridge 152. Plasma etching then forms a resulting tubular nanostructure 156.

Figure 5:
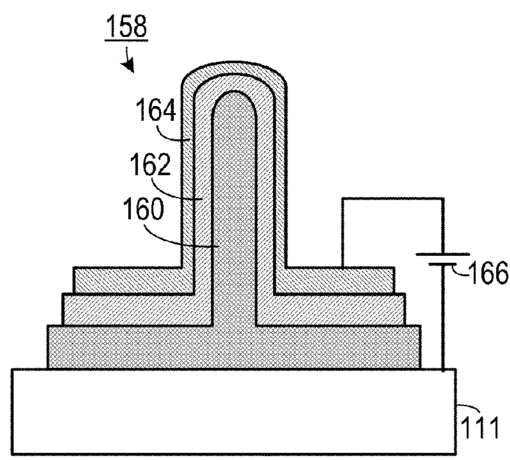
FIG. 5 is a schematic diagram of a light emitting structure employing a polymer nanostructure.

An example of a light emitting structure 158 employing the method disclosed above is shown in FIG. 5. In this example, an elongated polymer rod-like structure 160 is made as disclosed above from a first polymer (for example, a polymer including PEDOT:PSS) and disposed on a conductive substrate 111 (which could include, for example, an ITO glass). The elongated polymer rod-like structure 160 is coated with a second polymer layer 162. The second polymer layer 162 includes a material (for example, MEH-PPV) that causes a band gap to exists between the second polymer layer 162 and the elongated polymer rod-like structure 160. A conductive coating 164 (such as a metal, which could include aluminum) is disposed about the second polymer coating 162 so that the light emitting structure 158 emits light when a voltage 166 is applied between the conductive substrate 111 and the conductive coating 164.

Figure 6:
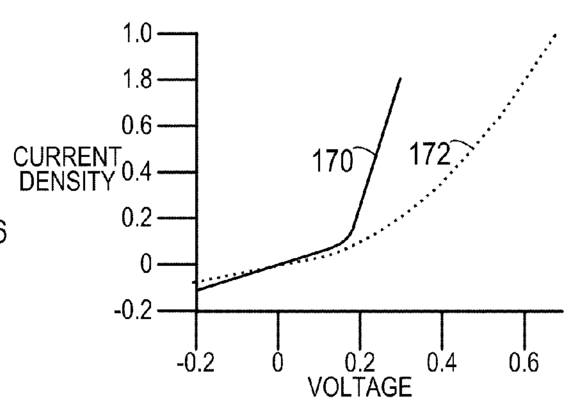
FIG. 6 is a graph showing current density versus voltage in a light emitting structure shown in FIG. 5, in comparison to a conventional organic light emitting diode.

As shown in FIG. 6, one experimental embodiment of the light emitting structure 158 exhibits a current density 170 as a function of voltage that is sharply greater than the current density curve 172 exhibited by a conventional light emitting diode. A pattern 180 of light being emitted by an array of light emitting structures of the type disclosed above is shown in FIG. 7.

In one experimental embodiment, polymer nanowire arrays were made from PEDOT:PSS to fabricate an organic polymer nanowire-OLED (organic light emitting diode) device. For the fabrication of the OLED device, a layer of PEDOT:PSS was spin coated onto ITO coated glass and baked for 10 minutes at 120° C. ICP etching for 20 minutes resulted in vertically aligned PEDOT:PSS nanowires with typical lengths of about 5 μm and diameters of about 400 nm. MEH-PPV was then spin coated on the polymer nanowire arrays followed by another 10-minute baking at 120° C. Finally, an aluminum electrode was deposited on top of the polymer layers via thermal evaporation in vacuum.

For comparison, a thin film OLED built from the same materials was also tested under the same conditions. The polymer nanowire-OLED demonstrated an ability to transport a maximum current density of about 40 times greater than what the thin film OLED could handle.

Figure 7:
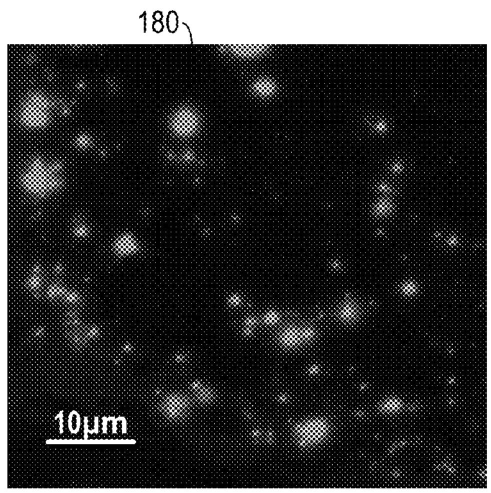
FIG. 7 is a micrograph showing light emitted from a plurality of light emitting structures of the type shown in FIG. 5.

By applying a DC voltage between the aluminum electrode and the ITO glass, the polymer nanowire-OLED generated many bright but tiny yellow dots of light as demonstrated in the micrograph 180 shown in FIG. 7. This is because the PEDOT:PSS nanowires provided a large surface area contacting the MEH-PPV layer where numerous photons were generated. The emission was possibly from the polymer nanowire tips owing to the enhanced local electric field. Thus, each polymer nanowire produced one bright spot covering an area of less than 1 $\mu m^2$, as the small yellow dots in FIG. 7 suggest.

When the polymer nanowires were bundled close to each other, the small individual dots could not be distinguished. Instead, bigger and brighter light spots were recorded. Utilizing the advantage of easy patterning, micro-sized light images can be created with this technique. The success of fabricating polymer nanowire-OLED indicates that the radiation damage introduced by plasma for fabricating the polymer nanowires, if any, is negligible at least for the current example.

Figure 8:
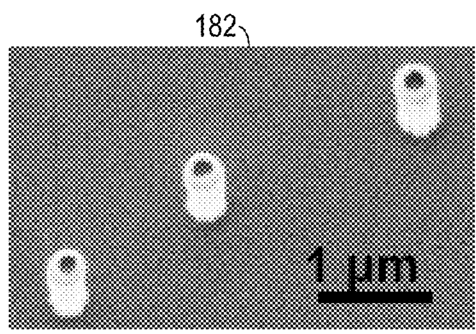
FIG. 8 is a micrograph of three polymer nanotubes.
Figure 9:
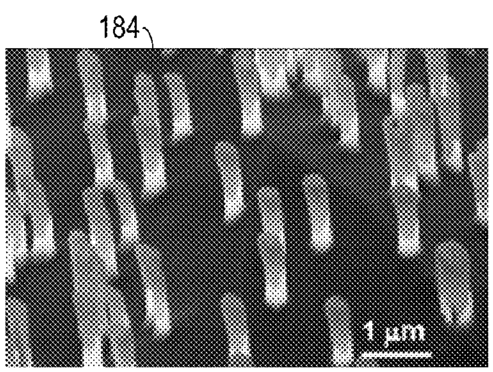
FIG. 9 is a micrograph of a plurality of polymer nanotubes.
Figure 10:
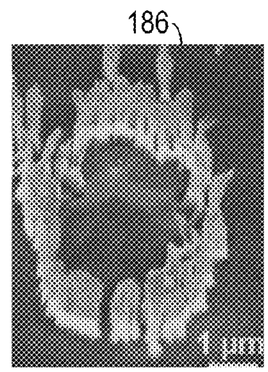
FIG. 10 is a micrograph of a ring of polymer elongated nanostructures.
Figure 11:
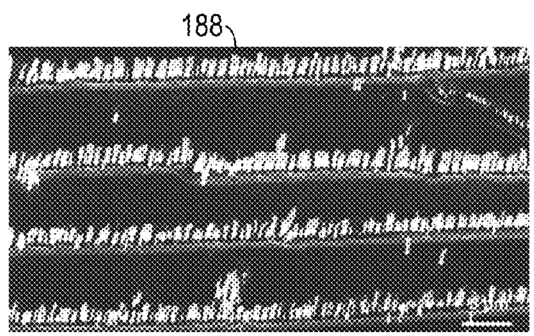
FIG. 11 is a micrograph of a plurality of polymer nanostructures disposed along lines.
Figure 12:
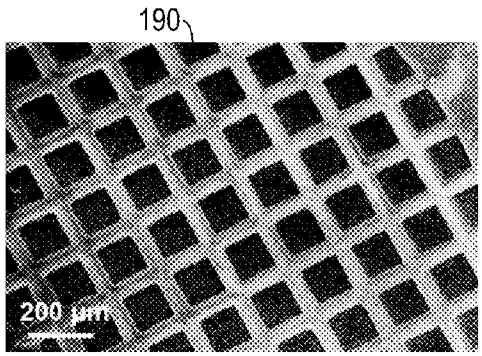
FIG. 12 is a micrograph of a plurality of polymer nanostructures arranged in crossed parallel lines.

A first micrograph 182 and a second micrograph 184 of tubular structures made according to the disclosure above is shown in FIGS. 8 and 9. A micrograph 186 showing a ring of polymer nanostructures made according to the disclosure above is shown in FIG. 10. A micrograph 188 showing a line of polymer nanostructures made according to the disclosure above is shown in FIG. 11. A micrograph 190 showing a patterned array of criss-crossing columns of polymer nanostructures made according to the disclosure above is shown in FIG. 12.

In one embodiment, surface roughness may be created by sputtering gold particles onto the surface of Kapton tape, which has been applied to a substrate. In another embodiment, ink printing onto the surface of the polymer may be used to create roughness.

In one experimental embodiment of a method for producing wafer-level aligned polymer nanowires, a one-step inductively coupled plasma (ICP) reactive ion etching process was employed. The polymer nanowire array was fabricated in an ICP reactive ion milling chamber with a pressure of 10 mTorr. Ar, $O_2$ and $CF_4$ gases were released into the chamber as etchants at flow rates of 15 sccm (standard cubic centimeters per minute), 10 sccm, and 40 sccm, respectively.

A middle ground between purely chemical wet etching and purely physical ion beam milling, plasma etching incorporates both a chemical etch component in the form of highly reactive neutral radicals, and a physical component in the form of plasma generated ions. Inputting gases that include $CF_4$, $O_2$ and Ar. $CF_4$ is commonly used as a chemical etchant for ICP silicon processing, as fluorine radicals created in the plasma react easily with Si. Oxygen is added in smaller quantities to remove unwanted polymer deposition created during treatment. For polymer ICP processing, atomic oxygen radicals generated from the oxygen gas are generally accepted to be the primary etchants. $CF_4$ is also frequently added to the mixture, as it has been shown to improve etch rates by increasing oxygen atom concentration. Excess fluorine, however, can slow the process by competing with oxygen for available polymer attack sites. Inert gasses, such as Ar, form positive ions that are incorporated to serve as a physical component to assist in the material degradation process.

In the experimental embodiment, a 400 W power source was used to generate dense plasma from the input gases. A second 100 W power source applied a voltage of approximately 600 V to accelerate the plasma toward the substrate. Both power sources operated at a frequency of 13.5 MHz. Helium gas also simultaneously flowed at the back of the substrate to maintain a temperature of 60° C. during fabrication.

In the experimental embodiment, patterns were created on polymer surfaces by scratching them using a micro-tip. In one experiment, a micromanipulator equipped with a 1-μm tungsten needle tip was used to draw a rectangular-like pattern on a 50 μm thick PS film, which was spin-coated on a silicon substrate. After 20-minute Plasma-Therm inductively coupled plasma (ICP) etching, PS polymer nanowires were formed along the lines scratched by the manipulator tip. The polymer nanowires were typically single lines along the scratched path, while the unscratched area remained flat. All of the polymer nanowires in the patterned lines exhibited a fairly uniform diameter of about 200 nm and height of about 5 μm.

Besides the direct writing patterning technique, other bottom-up processes have also been employed to generate aligned polymer nanowire patterns. For example, ring patterns were created by applying air bubbles on polymer surfaces. Drying of air bubbles left circular protrusions, which formed aligned polymer nanowire rings, such as the ring shown in FIG. 10. The smallest ring pattern had a diameter of about 1 μm, while the width of the polymer nanowires was less than 100 nm. In some examples, the polymer nanowires were "fused" together forming a continuous circular wall. The experimental data show that the polymer nanowire formation is due primarily to anisotropic ion bombardment of the polymer surface owing to local variation in curvature, which may possibly accelerated by additional chemical etching.

The patterned polymer nanowires can also be generated by conventional masking technology, which defines areas covered or not covered by polymer nanowires simply by blocking species from reacting with the polymer film. Owing to the vertical trajectory of ions, mostly sharp edges were observed. Half-pillar shaped features were engraved along the side wall indicating the vertical trajectory of ion bombardments. The mask pattern can also be easily reversed, analogous to the use of negative photoresist in lithography.

By stamping/touching a copper TEM grid on a uniform PS film and then peeling it off, the contact area can become rough, which produces high density polymer nanowire arrays after etching.

A series of experiments have been carried out to reveal the possible formation mechanism of the polymer nanowire arrays. The plasma etching has been observed to particularly amplify the areas that are either bumpy or with interfaces or imperfections, which become more pronounced after ion beam bombardment. Experimentally, polymer nanowires tend to grow at areas that have ripples or other surface roughness in the starting material. Although the protrusion of such wrinkles is only tens of nanometers, it creates a large enough change in local geometry that it leads to the formation of polymer nanowires. Because sputter yields are highly dependent on the incident beam angle, any initial roughness of the sample such that the material is positioned at an angle off-perpendicular to the beam will experience a difference in the effective ion beam incidence and become more pronounced after milling. Some chemically reacting species, however, are known for their isotropic etching profiles, which would tend to hinder nanowire formation.

Detailed examination reveals that polymer nanowires of PEDOT have dips at their top ends. Polymer NT arrays of MEH-PPV have been fabricated, which show a hollow tubular structure, with the wall of the tube made of tracks parallel to its axis, indicating that the interaction of the incident ions with the polymer is confined in a cigar-shape volume along its path.

In addition to the dominant physical process, chemical effect is also important. During etching, oxygen should be present to decompose the polymer and accelerate physical milling. In one experiment, no polymer nanowires were observed when a polymer sample was treated with Ar only. Polymer exposure to only $O_2$ created arrays of polymer nanowires, though with a lower density than those created with all gasses. In one experiment, samples treated with both $O_2$ and Ar also exhibited polymer nanowire formation, but these were sparse, thin, and of low quality, indicating a very high relative milling rate for these samples. The inability of argon to create nanowires alone, coupled with previous evidence that physical milling plays an active role in nanowire formation when all gasses (Ar, $O_2$, and $CF_4$) are present, implied that physical collisions (knock off), charge interaction and even chemical processes are at work.

The successful growth of aligned polymer nanowires from conductive or semiconducting polymers opens a great opportunity for developing polymer-based flexible nano-electronic devices. Traditionally, most flexible electronics such as OLEDs, organic solar cells, organic transistors, etc. are built on polymer thin films. Replacing the thin films with polymer nanowire arrays can significantly increase the contact surface area, enhancing charge transport properties. Solar cells based on nanowires have been shown to exhibit more efficient charge carrier separation and increased forward bias compared to thin film controls.

Using the above-disclosed methods, patterned polymer nanowire arrays of almost any polymer can be fabricated on any substrate by either micro-tip surface engineering or stamping induced surface roughness. The formation mechanism of the polymer nanowires/polymer nanotubes (PNTs) is suggested to be due to a dependence of the cone-shape interaction volume between the ion and the polymer on its local incident-angle at the modulated surface. The above-disclosed approach is a one-step method for cost-effective and large-scale fabrication of patterned and aligned polymer nanowire/PNT arrays on general substrates that can be easily integrated with silicon technology, having potential applications in OLEDs, flexible electronics, biosensors and synthetic muscles.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a polymer structure on a substrate, the method comprising the actions of:

a. applying a layer of a first polymer, having a horizontal top surface, to a surface of the substrate;

b. manipulating an area of the top surface of the first polymer so at to create a surface portion that is non-parallel to the horizontal top surface;

c. plasma etching the surface portion that is non-parallel to the horizontal top surface so as to remove a first portion from the layer of the first polymer thereby leaving the first polymer structure extending from the layer of the first polymer.

2. The method of claim 1, wherein the plasma etching action comprises:

a. placing the area of the top surface of the first polymer in an inductively coupled plasma reactive ion milling chamber; and b. introducing a chemical etchant gas into the inductively coupled plasma reactive ion milling chamber for a predetermined amount of time.

3. The method of claim 1, wherein applying action comprises the action of spin coating the first polymer onto the substrate.

4. The method of claim 1, wherein applying action comprises the action of applying a tape including the first polymer to the substrate.

5. The method of claim 1, wherein substrate comprises a material selected from a group consisting of: a crystalline substance, an amorphous substance, a fibrous material and combinations thereof.

6. The method of claim 1, wherein the action of manipulating an area of the top surface of the first polymer comprises the action of impressing an object onto the top surface of the first polymer.

7. The method of claim 1, wherein the action of manipulating an area of the top surface of the first polymer comprises scratching the top surface of the first polymer.

8. The method of claim 1, wherein the first polymer comprises a polymer selected from a group consisting of: PEDOT:PSS, PPY, SU8, PVDF, PMMA, PS, MEH-PPV, and combinations thereof.

9. The method of claim 1, wherein the substrate comprises a conductive substrate and wherein the first polymer structure comprises an elongated nanostructure, the method further comprising the actions of:

a. coating the elongated nanostructure with a coating of a second polymer, the second polymer including a material such that a band gap exists between the second polymer and the elongated nanostructure; and b. coating the second polymer with a conductive coating, wherein light is emitted when a voltage is applied between the conductive substrate and the conductive coating.

10. The method of claim 9, wherein the substrate comprises an ITO glass.

11. The method of claim 9, wherein the substrate comprises a flexible material.

12. The method of claim 9, wherein the first polymer comprises PEDOT:PSS.

13. The method of claim 9, wherein the second polymer comprises MEH-PPV.

14. The method of claim 9, wherein the conductive coating comprises a metal.

* * * * *